(12) United States Patent
Kim et al.

(10) Patent No.: US 7,119,392 B2
(45) Date of Patent: Oct. 10, 2006

(54) STORAGE ELECTRODE OF A SEMICONDUCTOR DEVICE AND METHOD OF FORMING THE SAME

(75) Inventors: Kyoung-Seok Kim, Seoul (KR); Ki-Hyun Hwang, Sungnam-si (KR); Hyo-Jung Kim, Gwacheon-si (KR); Hyeon-Deok Lee, Seoul (KR); Seok-Woo Nam, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/086,318

(22) Filed: Mar. 23, 2005

(65) Prior Publication Data

US 2005/0221576 A1    Oct. 6, 2005

(30) Foreign Application Priority Data

Apr. 2, 2004    (KR)    .................... 10-2004-0022840

(51) Int. Cl.
*H01L 21/8242*    (2006.01)
(52) U.S. Cl. .................... 257/306; 257/296; 257/295; 257/303; 257/E21.647
(58) Field of Classification Search ................ 257/306, 257/296, 295, 303
See application file for complete search history.

(56) References Cited

U.S. PATENT DOCUMENTS

| 6,380,579 B1* | 4/2002 | Nam et al. .................... 257/306 |
| 2001/0052614 A1* | 12/2001 | Ishibashi .................... 257/306 |
| 2003/0122174 A1* | 7/2003 | Fukuzumi .................... 257/306 |
| 2005/0205915 A1* | 9/2005 | Son .......................... 257/296 |

FOREIGN PATENT DOCUMENTS

| KR | 1020000065969 | 11/2000 |
| KR | 1020020043674 | 6/2002 |
| KR | 1020020055137 | 7/2002 |

* cited by examiner

*Primary Examiner*—Asok K. Sarkar
*Assistant Examiner*—Victor V. Yevsikov
(74) *Attorney, Agent, or Firm*—Lee & Morse, P.C.

(57) ABSTRACT

In a storage electrode of a semiconductor device, and a method of forming the same, the storage electrode includes an outer cylinder including a first outer cylindrical portion having a first outer diameter, and a second outer cylindrical portion that is formed on the first outer cylindrical portion and having a second outer diameter, which is less than the first outer diameter, the first and second outer cylindrical portions having substantially equal inner diameters, and an inner cylinder formed on inner surfaces of the outer cylinder.

21 Claims, 17 Drawing Sheets

STORAGE ELECTRODE OF A SEMICONDUCTOR DEVICE AND METHOD OF FORMING THE SAME

BACKGROUND OF THE INVENTION

1. Field of the Invention

The present invention relates to a storage electrode of a semiconductor device and a method of forming the storage electrode. More particularly, the present invention relates to a cylindrical storage electrode of a semiconductor memory device, e.g., a dynamic random access memory (DRAM) device, which is used for storing data, and a method of forming the storage electrode.

2. Description of the Related Art

Generally, a semiconductor memory device, such as a DRAM device, stores information, e.g., data, program orders, and the like. The information may be read from the semiconductor memory device and other information may be additionally stored in the semiconductor memory device. The semiconductor memory device may include one transistor and one capacitor.

The capacitor in the DRAM device may include a storage electrode, a dielectric layer and a plate electrode. To improve capacity of the memory device including the capacitor, a capacitance of the capacitor is increased. Particularly, when the capacitance of the capacitor is increased, a read capacity of the memory device is improved and an error ratio generated in the memory device is reduced, thereby improving memory characteristics of the memory device.

However, as memory devices have become more highly integrated, forming a capacitor having a sufficient capacitance in a cell having very small area has become increasingly difficult. To overcome the above difficulty, various methods have been studied.

Examples of these methods include a method of increasing a height of a capacitor and a method of expanding an effective area of a cell using a hemispherical silicon grain (HSG), among others.

According to the method of increasing the height of the capacitor, however, the higher a storage electrode is, the thicker a mold layer for a mold is required to be. When an opening filled with the storage electrode is formed through an insulation layer by a dry etching process, the opening has a bottom width narrower than a top width due to the thick mold layer. As a result, the storage electrode has a shape corresponding to that of the opening. More specifically, the storage electrode has a bottom width narrower than a top width, thereby shortening an interval between adjacent storage electrodes. As a result, adjacent storage electrodes lean so that a 2-bit error between adjacent storage electrodes may be generated and also the leaning storage electrodes contact each other, thereby generating an electrical short between adjacent storage electrodes.

According to the method using the HSG, a HSG layer having an uneven shape is formed on a storage electrode. However, pieces are fractured from the HSG layer or coarse polysilicon grains grow from the storage electrode during formation of the HSG layer so that the pieces or the coarse polysilicon grains may contact an adjacent storage electrode, thereby generating an electrical short between adjacent storage electrodes.

According to a conventional method for overcoming such an electrical short, a storage electrode includes a doped amorphous silicon layer and an undoped amorphous silicon layer. An upper portion of the storage electrode is partially removed using an etching selectivity between the silicon layers to form a HSG layer.

However, since the HSG layer is formed by etching the storage electrode including substantially identical materials, the etching selectivity may be relatively low. Therefore, forming the HSG layer to have a wide surface area may be difficult.

SUMMARY OF THE INVENTION

The present invention is therefore directed to a storage electrode of a semiconductor device and a method of forming the storage electrode, which substantially overcome one or more of the problems due to the limitations and disadvantages of the related art.

It is a feature of an embodiment of the present invention to provide a storage electrode of a semiconductor device, and a method of forming the same, which is readily formed using a high etching selectivity.

It is another feature of an embodiment of the present invention to provide a storage electrode of a semiconductor device, and a method of forming the same, which permits adjacent storage electrodes to be spaced sufficiently far apart from each other so that a 2-bit error generated between leaning storage electrodes may be prevented and formation of a bridge between the leaning storage electrodes may be avoided.

It is still another feature of an embodiment of the present invention to provide a storage electrode of a semiconductor device, and a method of forming the same, in which a HSG layer may not exist on outer surfaces of the storage electrode or a HSG layer on outer surfaces of the storage electrode may have a relatively smaller size as compared to that of a HSG layer on inner surfaces of the storage electrode, so that formation of a bridge between adjacent storage electrodes may be avoided.

At least one of the above and other features and advantages of the present invention may be realized by providing a storage electrode of a semiconductor device including an outer cylinder including a first outer cylindrical portion having a first outer diameter, and a second outer cylindrical portion that is formed on the first outer cylindrical portion and having a second outer diameter, which is less than the first outer diameter, the first and second outer cylindrical portions having substantially equal inner diameters and an inner cylinder formed on inner surfaces of the outer cylinder.

The outer cylinder may further include a closed outer bottom surface, and the inner cylinder may further include a closed inner bottom surface formed on the closed outer bottom surface.

The inner cylinder may include a first inner cylindrical portion having a first inner diameter and a second inner cylindrical portion formed on the first inner cylindrical portion and having a second inner diameter, which is greater than the first inner diameter, the first and second inner cylindrical portions having substantially equal outer diameters. A thickness of the first inner cylindrical portion may be about 200 Å to about 600 Å. A thickness of the second inner cylindrical portion may be about 20 Å to about 100 Å less than a thickness of the first inner cylindrical portion.

The inner cylinder may further include a hemispherical silicon grain (HSG) layer.

In a first embodiment of the present invention, the HSG layer may be formed on inner surfaces of the inner cylinder. The HSG layer may include a first HSG layer formed on inner surfaces of the second inner cylindrical portion and having a first grain size and a second HSG layer formed on inner surfaces of the first inner cylindrical portion and having a second grain size, which is greater than the first grain size.

In a second embodiment of the present invention, the HSG layer may be formed on inner surfaces of the inner cylinder and outer surfaces of the outer cylinder. The HSG layer may include a first HSG layer formed on outer and upper surfaces of the outer cylinder and having a first grain size and a second HSG layer formed on inner and upper surfaces of the inner cylinder and having a second grain size, which is greater than the first grain size.

A height of the second outer cylindrical portion may be about 0.3 to about 0.5 times a height of the outer cylinder.

A thickness of the first outer cylindrical portion may be about 200 Å to about 600 Å. A thickness of the second outer cylindrical portion may be about 20 Å to about 100 Å less than a thickness of the first outer cylindrical portion.

An oxidation rate of the outer cylinder may be greater than an oxidation rate of the inner cylinder.

A migration speed of atoms in the outer cylinder may be less than a migration speed of atoms in the inner cylinder.

The outer cylinder may include a heavily doped amorphous silicon layer. The outer cylinder may be doped with phosphorous having a concentration of about $10 \times 10^{19}$ to about $5 \times 10^{21}$ atoms/cm$^3$.

The inner cylinder may include a lightly doped amorphous silicon layer. The inner cylinder may be doped with phosphorous having a concentration of about $10 \times 10^{19}$ to about $5 \times 10^{21}$ atoms/cm$^3$.

At least one of the above and other features and advantages of the present invention may be realized by providing a storage electrode of a semiconductor device including a cylinder body including an outer cylinder, and an inner cylinder formed on inner surfaces of the outer cylinder and a hemispherical silicon grain (HSG) layer including a first HSG layer formed on upper inner side surfaces of the inner cylinder and having a first grain size, and a second HSG layer formed on lower inner side surfaces of the inner cylinder and having a second grain size, which is greater than the first grain size. The outer cylinder may include a closed outer bottom surface, the inner cylinder may include a closed inner bottom surface formed on the closed outer bottom surface, and the second HSG layer is formed on the closed inner bottom surface.

At least one of the above and other features and advantages of the present invention may be realized by providing a method of forming a storage electrode including forming a preliminary outer cylinder on a substrate, forming a preliminary inner cylinder on inner surfaces of the preliminary outer cylinder, and partially exposing upper portions of the preliminary outer and inner cylinders to form a cylinder body including an outer cylinder and an inner cylinder formed on inner surfaces of the outer cylinder, wherein the outer cylinder includes a first outer cylindrical portion having a first outer diameter, and a second outer cylindrical portion formed on the first outer cylindrical portion and having a second outer diameter, which is less than the first outer diameter, the first and second outer cylindrical portions having substantially equal inner diameters.

Forming the inner cylinder of the cylinder body may include forming a first inner cylindrical portion having a first inner diameter and forming a second inner cylindrical portion on the first inner cylindrical portion, the second inner cylindrical portion having a second inner diameter, which is greater than the first inner diameter, the first and second inner cylindrical portions having substantially equal outer diameters.

The method may further include forming a closed outer bottom surface of the outer cylinder on the substrate and forming a closed inner bottom surface of the inner cylinder on the closed outer bottom surface.

The method may further include forming a hemispherical silicon grain (HSG) layer on the cylinder body.

In a first embodiment of the present invention, forming the HSG layer may include forming the HSG layer on inner surfaces of the inner cylinder. Forming the HSG layer may include forming a first HSG layer on inner side surfaces of the second inner cylindrical portion, the first HSG layer having a first grain size, and forming a second HSG layer on inner side surfaces of the first inner cylindrical portion, the second HSG layer having a second grain size, which is greater than the first grain size.

In a second embodiment of the present invention, forming the HSG layer may include forming the HSG layer on inner surfaces of the inner cylinder and on outer surfaces of the outer cylinder. Forming the HSG layer may include forming a first HSG layer on outer and upper surfaces of the outer cylinder, the first HSG layer having a first grain size, and forming a second HSG layer on inner and upper surfaces of the inner cylinder, the second HSG layer having a second grain size, which is greater than the first grain size.

Forming the preliminary outer and inner cylinders may include forming an insulation layer on the substrate, partially etching the insulation layer to form an opening exposing the substrate, forming the preliminary outer and inner cylinders in the opening, and forming a sacrificial insulation layer pattern on the preliminary inner cylinder.

Forming the cylinder body may include partially removing the etched insulation layer and the sacrificial insulation layer pattern using a first wet etching solution to partially expose the preliminary outer and inner cylinders, oxidizing the exposed preliminary outer and inner cylinders to form an oxide layer on the preliminary outer and inner cylinders, and removing the oxide layer, the etched insulation layer and the sacrificial insulation layer pattern using a second wet etching solution to form the cylinder body.

Oxidizing the exposed preliminary outer and inner cylinders may be performed at a temperature of about 600° C. to about 900° C.

The first and second wet etching solutions may include an aqueous hydrogen fluoride (HF) solution.

At least one of the above and other features and advantages of the present invention may be realized by providing a method of forming a storage electrode including forming an outer cylinder on a substrate, forming an inner cylinder on inner surfaces of the outer cylinder, and forming a hemispherical silicon grain (HSG) layer on inner side surfaces of the inner cylinder, wherein the HSG layer includes a first HSG layer formed on upper inner side surfaces of the inner cylinder and having a first grain size, and a second HSG layer formed on lower inner side surfaces of the inner cylinder and having a second grain size, which is greater than the first grain size. The method may further include forming a closed outer bottom surface of the outer cylinder on the substrate and forming a closed inner bottom surface of the inner cylinder on the closed outer bottom surface, the second HSG layer formed on the closed inner bottom surface.

According to the embodiments of the present invention, storage electrodes may be spaced sufficiently far apart from each other so that a 2-bit error generated between leaning storage electrodes may be prevented and formation of a bridge between the leaning storage electrodes may be avoided.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
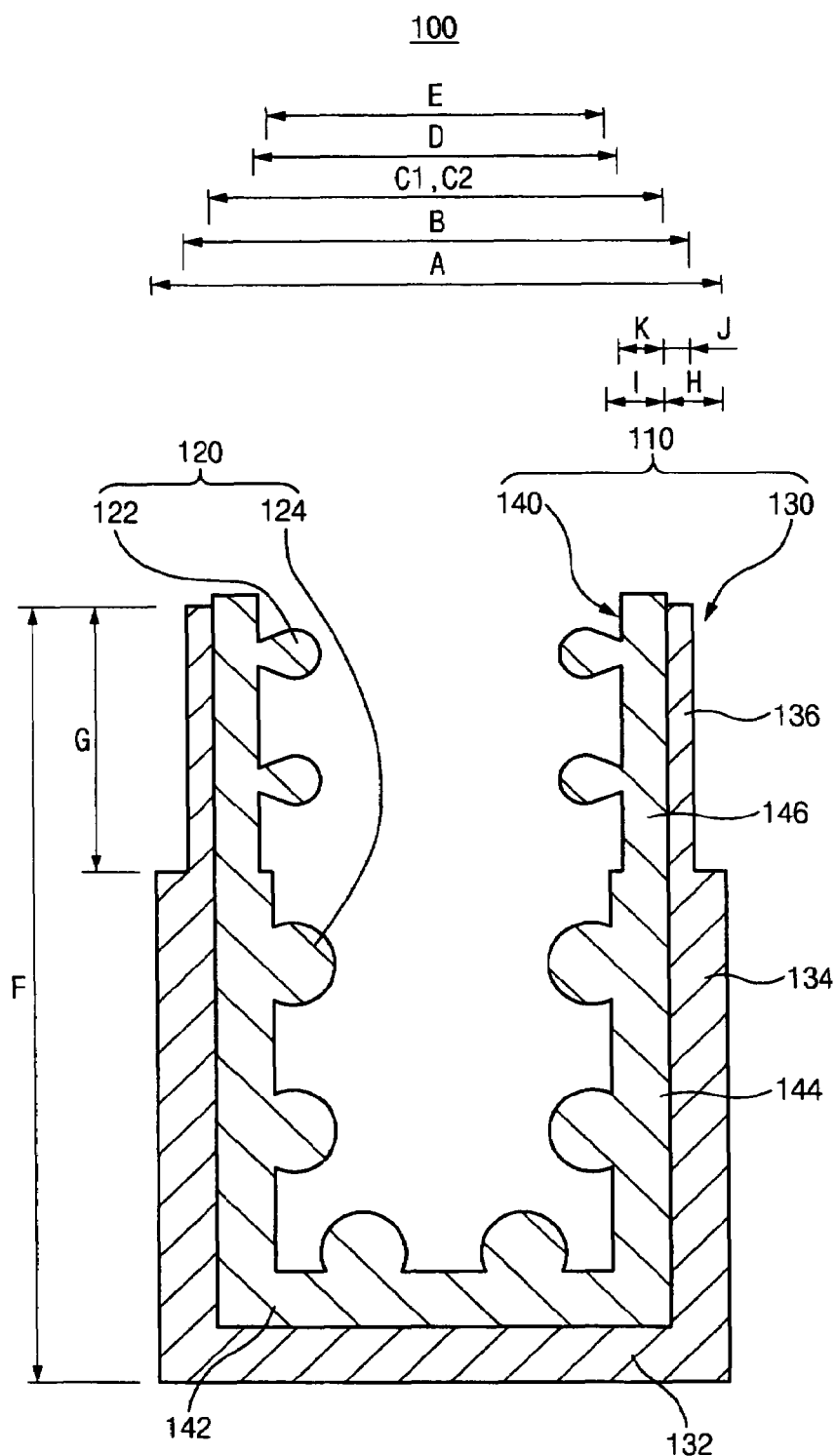
FIG. 1 illustrates a cross-sectional view of a storage electrode of a semiconductor device in accordance with a first embodiment of the present invention.

Korean Patent Application No. 2004-22840, filed on Apr. 2, 2004, in the Korean Intellectual Property Office, and entitled: "Storage Electrode of a Semiconductor Device and Method of Forming the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of elements, layers and regions are exaggerated for clarity of illustration. It will also be understood that when an element or a layer is referred to as being "on" or "onto" another element, layer or substrate, it can be directly on the other element, layer or substrate, or intervening elements or layers may also be present. Like reference numerals refer to like elements throughout.

A storage electrode of a semiconductor device and a method of forming the storage electrode in accordance with embodiments of the present invention will now be described.

First Embodiment

FIG. 1 illustrates a cross-sectional view of a storage electrode of a semiconductor device in accordance with a first embodiment of the present invention.

Referring to FIG. 1, a storage electrode 100 in accordance with the first embodiment includes a cylinder body 110 and a hemispherical silicon grain (HSG) layer 120. The cylinder body 110 includes an outer cylinder 130 and an inner cylinder 140 formed on inner surfaces of the outer cylinder 130. The HSG layer 120 is formed on inner surfaces of the inner cylinder 140.

The outer cylinder 130 may have a cylindrical shape having an open top and a closed bottom surface 132. The outer cylinder 130 may include a first outer cylindrical portion 134 having a first outer diameter A, and a second outer cylindrical portion 136 formed on the first outer cylindrical portion 136, the second outer cylindrical portion 136 having a second outer diameter B, which is less than the first outer diameter A. The first and second outer cylindrical portions 134 and 136 may have substantially equal inner diameters C1.

The inner cylinder 140 may have a cylindrical shape having an open top and a closed bottom surface 142. The inner cylinder 140 may include a first inner cylindrical portion 144 having a first inner diameter D, and a second inner cylindrical portion 146 formed on the first inner cylindrical portion 146, the second inner cylindrical portion 146 having a second inner diameter E, which is greater than the first inner diameter D. The first and second inner cylindrical portions 144 and 146 may have substantially equal outer diameters C2. The outer diameters C2 of the first and second inner cylindrical portions 144 and 146 may be substantially equal to the inner diameters C1 of the first and second outer cylindrical portions 134 and 136.

The second outer cylindrical portion 136 has a height G that may be about 0.3 to about 0.5 times a height F of the outer cylinder 130. A thickness H of the first outer cylindrical portion 134 and a thickness I of the first inner cylindrical portion 144 may be about 200 Å to about 600 Å. The second outer cylindrical portion 136 has a thickness J, which is less than a thickness H of the first outer cylindrical portion 134 by about 20 Å to about 100 Å. The second inner cylindrical portion 146 has a thickness K, which is less than the thickness I of the first inner cylindrical portion 144 by about 20 Å to about 100 Å. In addition, the thickness J of the second outer cylindrical portion 136 may be greater than the thickness K of the second inner cylindrical portion 146.

The outer cylinder 130 may include heavily doped amorphous silicon having a first oxidation rate. The outer cylinder 130 may be doped with phosphorous having a concentration of about $10 \times 10^{19}$ to about $5 \times 10^{21}$ atoms/cm$^3$ (about 1.0 to about 2.0 by weight percents). The phosphorous may preferably have a concentration of about $9.9 \times 10^{20}$ atoms/cm$^3$.

The inner cylinder 140 may include lightly doped amorphous silicon having a second oxidation rate, which is less than the first oxidation rate. The inner cylinder 140 may be doped with phosphorous having a concentration of about $10 \times 10^{19}$ to about $5 \times 10^{21}$ atoms/cm$^3$ (about 1.0 to about 2.0 by weight percents). The phosphorous may preferably have a concentration of about $2 \times 10^{20}$ atoms/cm$^3$.

The HSG layer 120 is formed on inner surfaces of the inner cylinder 140. The HSG layer 120 may include a first HSG layer 122 formed on inner surfaces of the second inner cylindrical portion 146 and a second HSG layer 124 formed on inner surfaces of the first inner cylindrical portion 144. The first HSG layer 122 may have a first grain size, which is less than a second grain size of the second HSG layer 124.

FIGS. 2 through 10 illustrate cross-sectional views of stages in a method of forming the storage electrode shown in FIG. 1.

Figure 2:
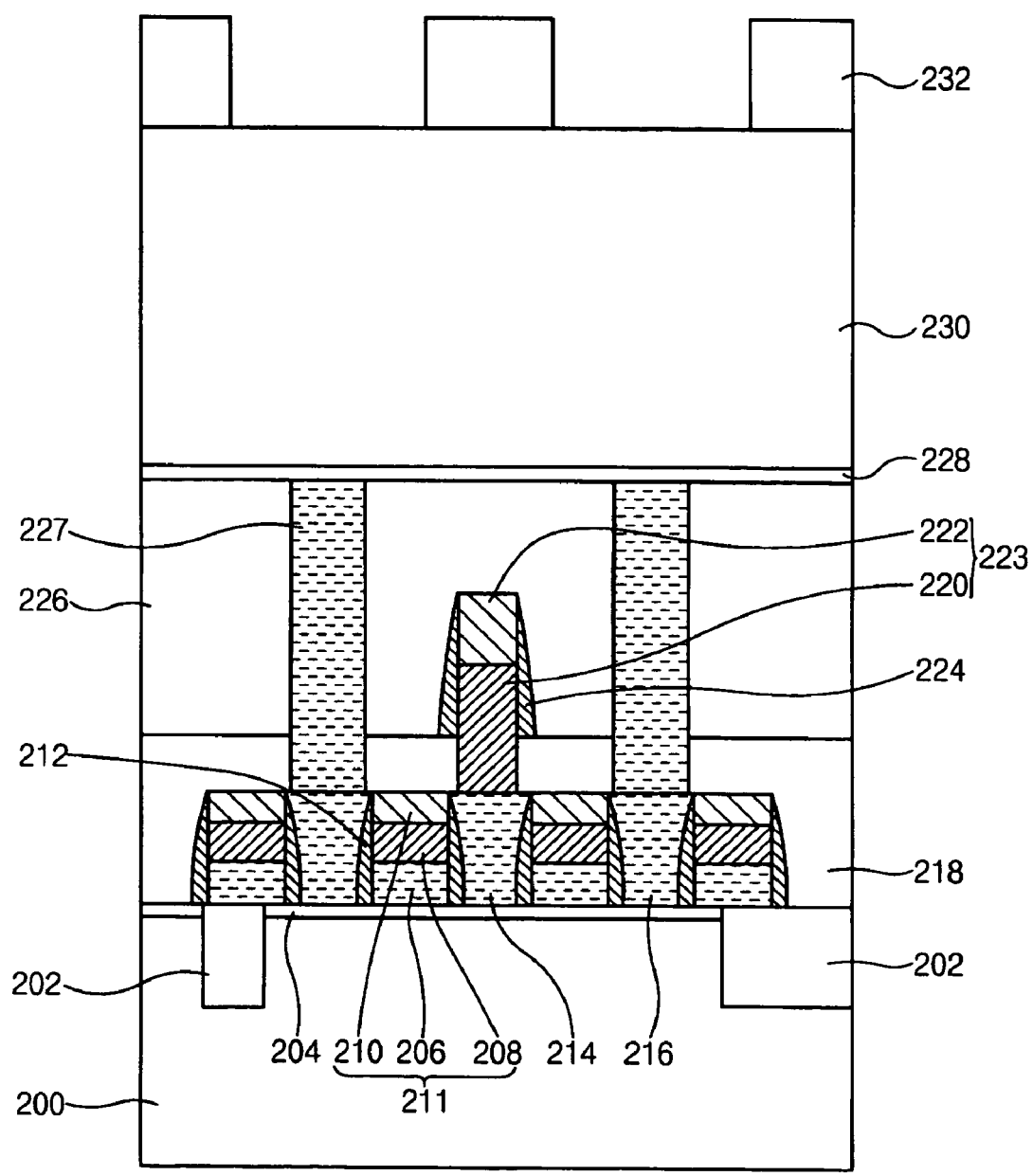
FIGS. 2 through 10 illustrate cross-sectional views of stages in a method of forming the storage electrode shown in FIG. 1.

Referring to FIG. 2, a trench-type isolation layer 202 is formed in a semiconductor substrate 200 to divide the semiconductor substrate 200 into an active region and a field region. An active device is formed in the active region. An example of the active device is a MOS transistor. In the first embodiment, a MOS transistor is exemplarily illustrated.

In the method, a gate oxide layer 204 is formed on the semiconductor substrate 200 having the isolation layer 202. A first polysilicon layer (not shown) is formed on the gate oxide layer 204. A tungsten silicide layer (not shown) is formed on the first polysilicon layer. A first silicon nitride layer (not shown) is formed on the tungsten silicide layer.

A photoresist film (not shown) is formed on the first silicon nitride layer. The photoresist film is exposed and developed to form a photoresist pattern (not shown). The first silicon nitride layer, the tungsten silicide layer and the first polysilicon layer are sequentially etched using the photoresist pattern as an etching mask to form gate electrode structures 211 including a first polysilicon layer pattern 206, a first tungsten silicide layer pattern 208 and a first silicon nitride layer pattern 210. The gate electrode structures 211 are disposed substantially parallel and are spaced apart from each other.

A second silicon nitride layer (not shown) is formed on the gate oxide layer 204 and the gate electrode structures 211. The second silicon nitride layer is etched back to form first spacers 212 on sidewalls of the gate electrode structures 211.

Impurities are implanted into the active region using the gate electrode structures 211 as an ion-implanting mask to form source/drain regions (not shown), thereby completing the MOS transistor.

First openings (not shown) are formed by a self-aligned contact (SAC) process. A conductive layer (not shown), e.g., a polysilicon layer, is formed on the gate oxide layer 204 and the gate electrode structures 211 to fill the first openings with the conductive layer. The conductive layer is planarized, e.g., by a chemical mechanical polishing (CMP) process, to form a source contact plug 216 and a drain contact plug 214 in the first openings.

A first insulation layer 218 is formed on the gate oxide layer 204, the gate electrode structures 211, the source contact plug 216 and the drain contact plug 214. The first insulation layer 218 is then planarized, e.g., by a CMP process.

Second openings (not shown) are formed through the first insulation layer 218 to expose the drain contact plug 214. A second polysilicon layer (not shown) is formed on the first insulation layer 218 to fill the second openings with the second polysilicon layer. A third silicon nitride layer (not shown) is formed on the second polysilicon layer.

A photoresist film (not shown) is formed on the third silicon nitride layer. The photoresist film is exposed and developed to form a photoresist pattern (not shown). The third silicon nitride layer and the second polysilicon layer are etched using the photoresist pattern as an etching mask to form a bit line structure 223 including a second polysilicon layer pattern 220 and a third silicon nitride layer pattern 222.

A fourth silicon nitride layer (not shown) is formed on the first insulation layer 218 and the bit line structure 223. The fourth silicon nitride layer is etched back to form a second spacer 224 on a sidewall of the bit line structure 223.

A second insulation layer 226 is formed on the first insulation layer 218 and the bit line structure 223. The second insulation layer 226 is then planarized, e.g., by a CMP process. Third openings (not shown) are formed through the second insulation layer 226 to expose the source contact plug 216. A conductive layer, e.g., a polysilicon layer, is formed on the second insulation layer 226 to fill the second openings with the conductive layer. The conductive layer is then planarized, e.g., by a CMP process, to form a storage contact plug 227.

An etching stop layer 228, e.g., a silicon nitride layer, is formed on the second insulation layer 226. A third insulation layer 230 used for a mold layer is formed on the etching stop layer 228. The third insulation layer 230 may have a thickness of about 18,000 Å. A photoresist film (not shown) is formed on the third insulation layer 230. The photoresist film is exposed and developed to form a photoresist pattern 232 for defining a region in which a capacitor is to be formed.

Figure 3:
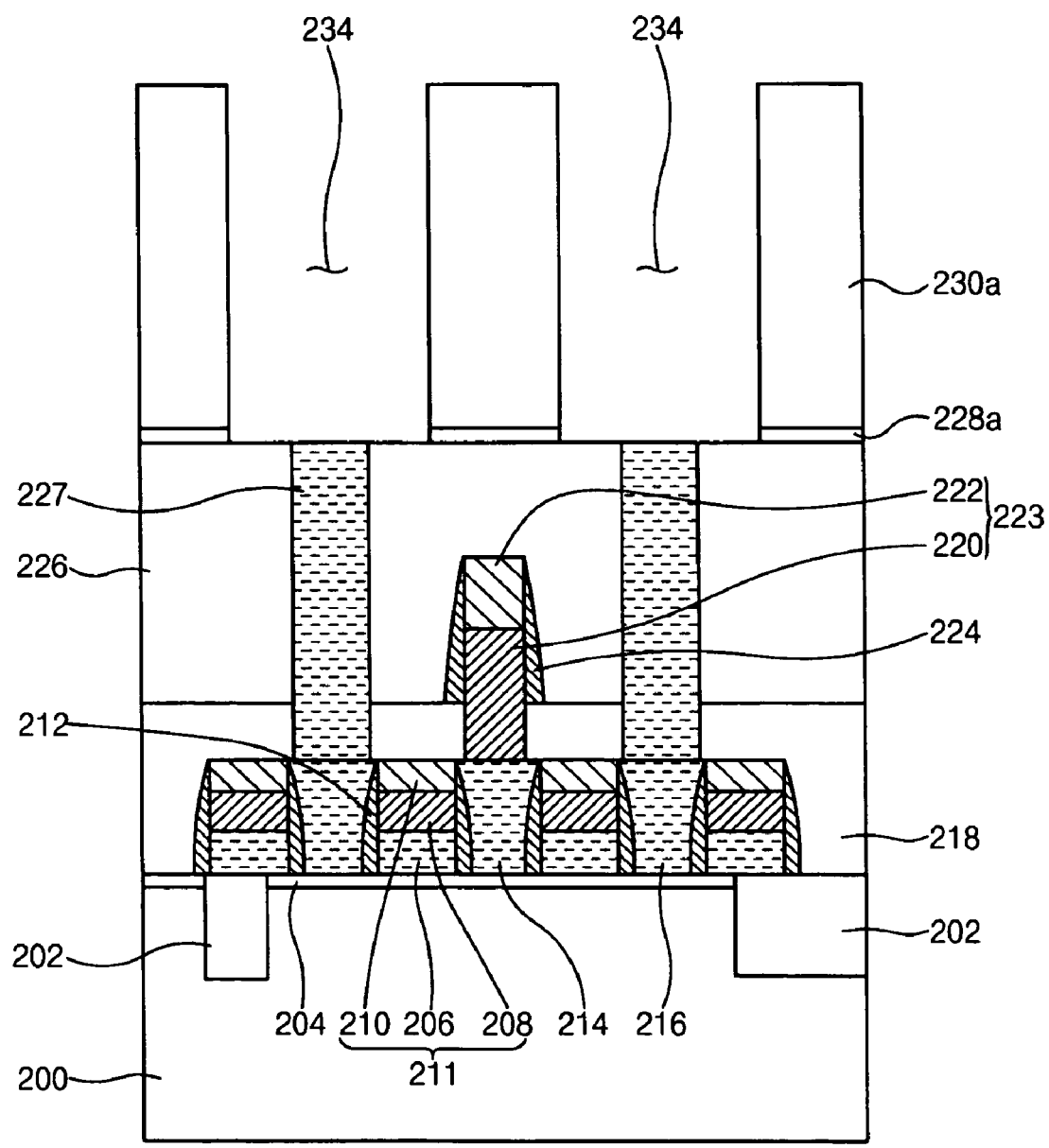

Referring to FIG. 3, the third insulation layer 230 and the etching stop layer 228 are sequentially etched using the photoresist pattern 232 as an etching mask to form a third insulation layer pattern 230a having fourth openings 234 and an etching stop layer pattern 228a, thereby exposing the contact plug 227 and the second insulation layer 226 through the fourth openings 234.

Figure 4:
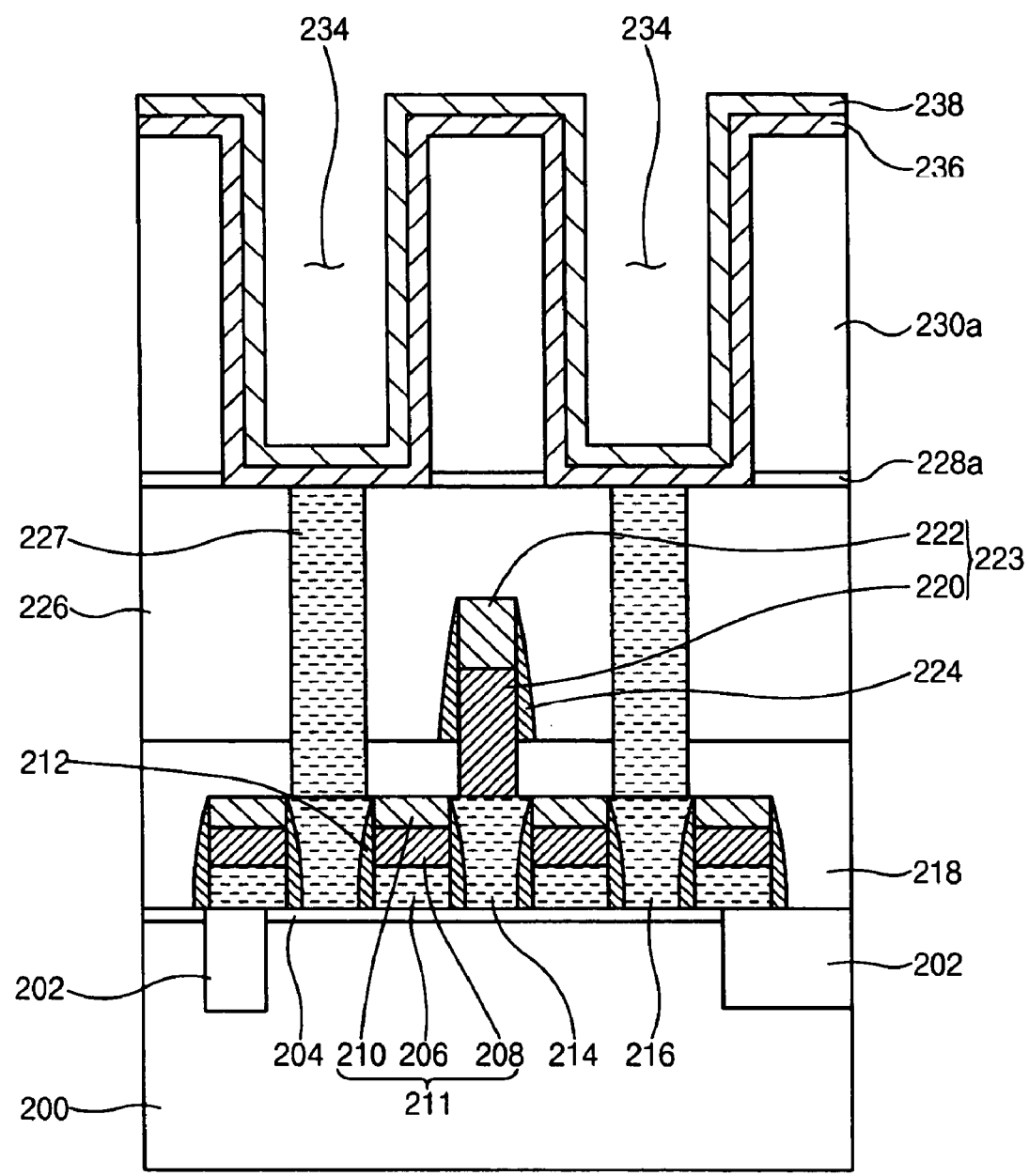

Referring to FIG. 4, a first amorphous silicon layer 236 is formed on the third insulation layer pattern 230a and inner surfaces, i.e., side and bottom surfaces, of the fourth openings 234. The first amorphous silicon layer 236 has a first oxidation rate. Also, silicon atoms in the first amorphous silicon layer 236 have a first migration speed. A second amorphous silicon layer 238 is formed on the first amorphous silicon layer 236. The second amorphous silicon layer 238 has a second oxidation rate, which is less than the first oxidation rate. Also, silicon atoms in the second amorphous silicon layer 238 have a second migration speed, which is greater than the first migration speed.

An example of the first amorphous silicon layer 236 may preferably be an amorphous silicon layer heavily doped with impurities. An example of the second amorphous silicon layer 238 is an amorphous silicon layer lightly doped with impurities, which may be phosphorous. The doping of the impurities may be performed simultaneously with the formation of the first and second amorphous silicon layers 236 and 238. Also, the first and second amorphous silicon layers 236 and 238 may be formed in-situ.

Further, examples of a source gas used for forming the first and second amorphous silicon layers 236 and 238 include a silane based gas, e.g., a monosilane gas, a disilane gas, dichlorosilane gas, etc. An example of a source gas used for implanting the impurities is $PH_3$ gas.

The first and second amorphous silicon layers 236 and 238 may be doped with impurities having a concentration of about $10 \times 10^{19}$ to about $5 \times 10^{21}$ atoms/cm$^3$ (about 1.0 to about 2.0 by weight percents). The first amorphous silicon layer 236 may preferably be doped with impurities having a concentration of about $9.9 \times 10^{20}$ atoms/cm$^3$ and the second amorphous silicon layer 238 may preferably be doped with impurities having a concentration of about $2 \times 10^{20}$ atoms/cm$^3$. Also, thicknesses of the first and second amorphous silicon layers 236 and 238 may vary in accordance with an integration degree of a memory device, and a height and a width of a storage electrode. In the first embodiment, the thicknesses of the first and second amorphous silicon layers 236 and 238 may be about 200 Å to about 600 Å.

As above described, when the first and second amorphous silicon layers 236 and 238 are sequentially formed, the first amorphous silicon layer 236 has an oxidized thickness greater than that of the second amorphous silicon layer 238, because the first amorphous silicon layer 236 has the first oxidation rate, which is greater than the second oxidation rate of the second amorphous silicon layer 238.

In addition, since the silicon atoms in the first amorphous silicon layer 236 move slower than those in the second amorphous silicon layer 238 due to the difference between the concentrations of the impurities, a HSG layer grown from the first amorphous silicon layer 236 has a size smaller than that grown from the second amorphous silicon layer 238.

Figure 10:
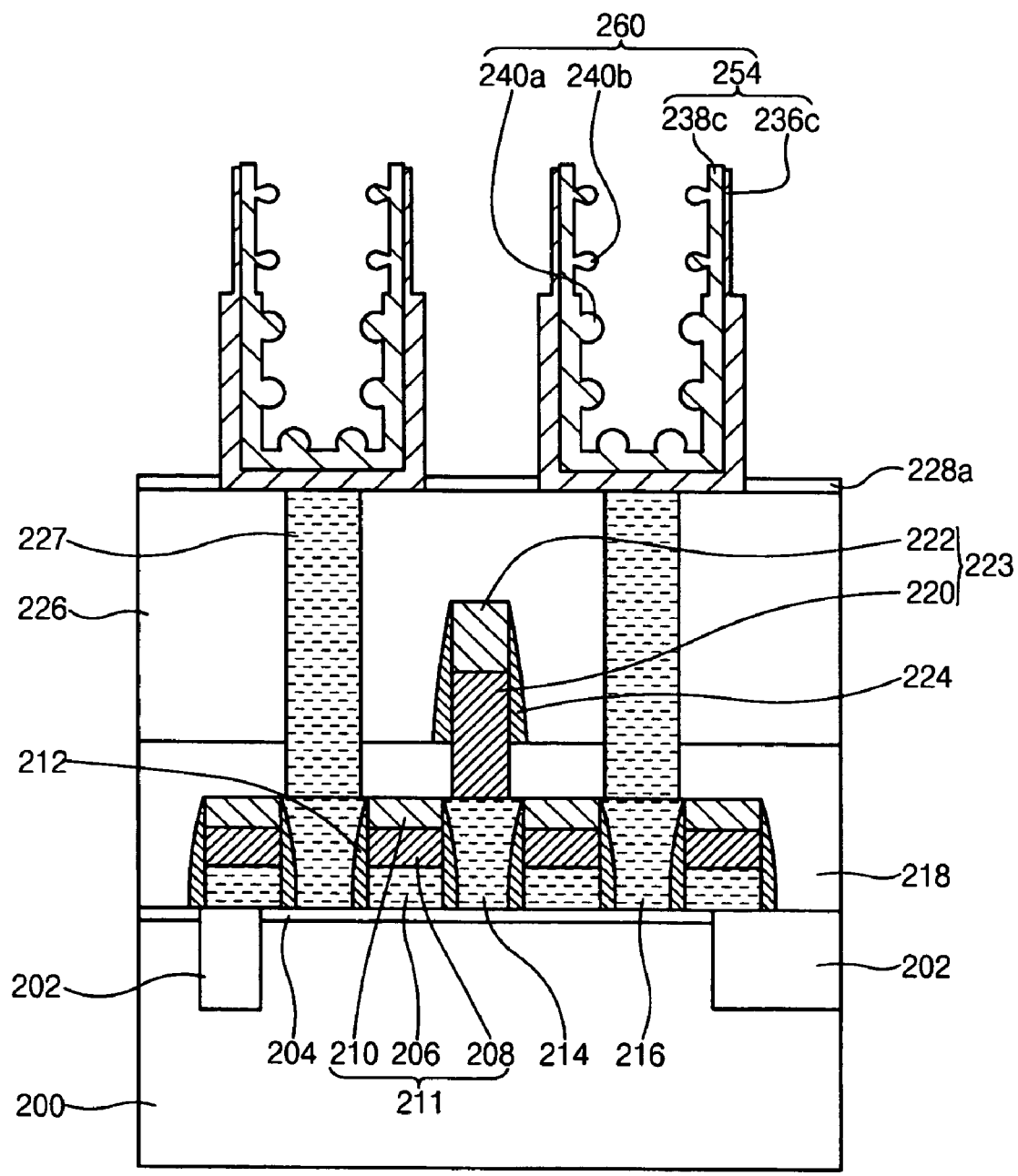

Thus, when the storage electrode, as shown in FIG. 10, is completed by the following processes, the first amorphous silicon layer 236 functions as the outer cylinder of the cylinder body so that an interval between the storage electrodes may be increased. The second amorphous silicon layer 238 functions as the inner cylinder of the cylinder body so that the HSG layer is formed only on inner surfaces of the inner cylinder, thereby increasing a capacitance of a capacitor.

Figure 5:
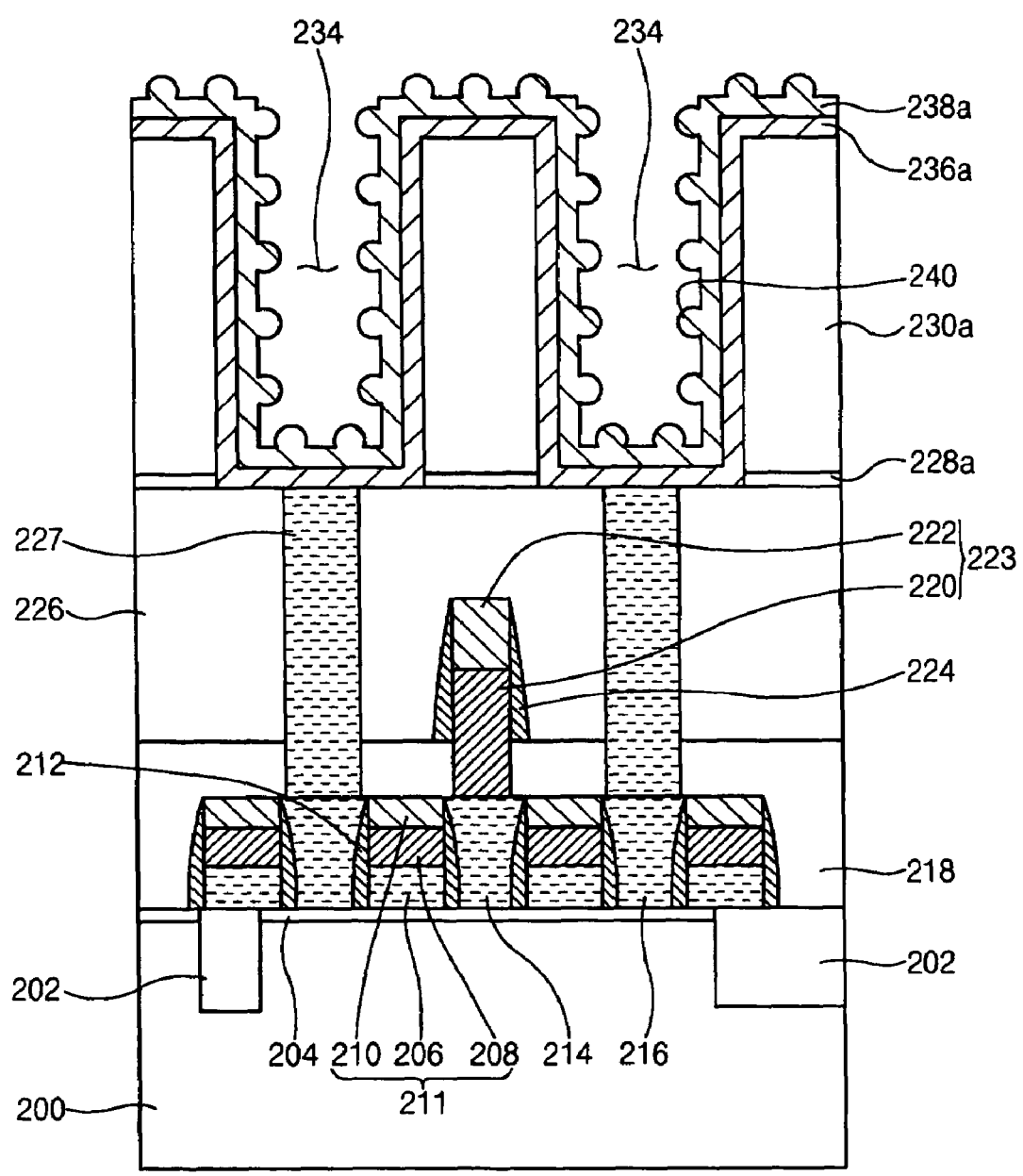

Referring to FIG. 5, a silane based gas as a seed gas is applied to the second amorphous silicon layer 238 under vacuum. The silicon atoms in the second amorphous silicon layer 238 are reacted with atoms in the silane based gas to grow a preliminary HSG layer 240 from the second amorphous silicon layer 238. Simultaneously, the first and second amorphous silicon layers 236 and 238 are crystallized to form crystallized first and second amorphous silicon layers 236a and 238a, respectively.

Figure 6:
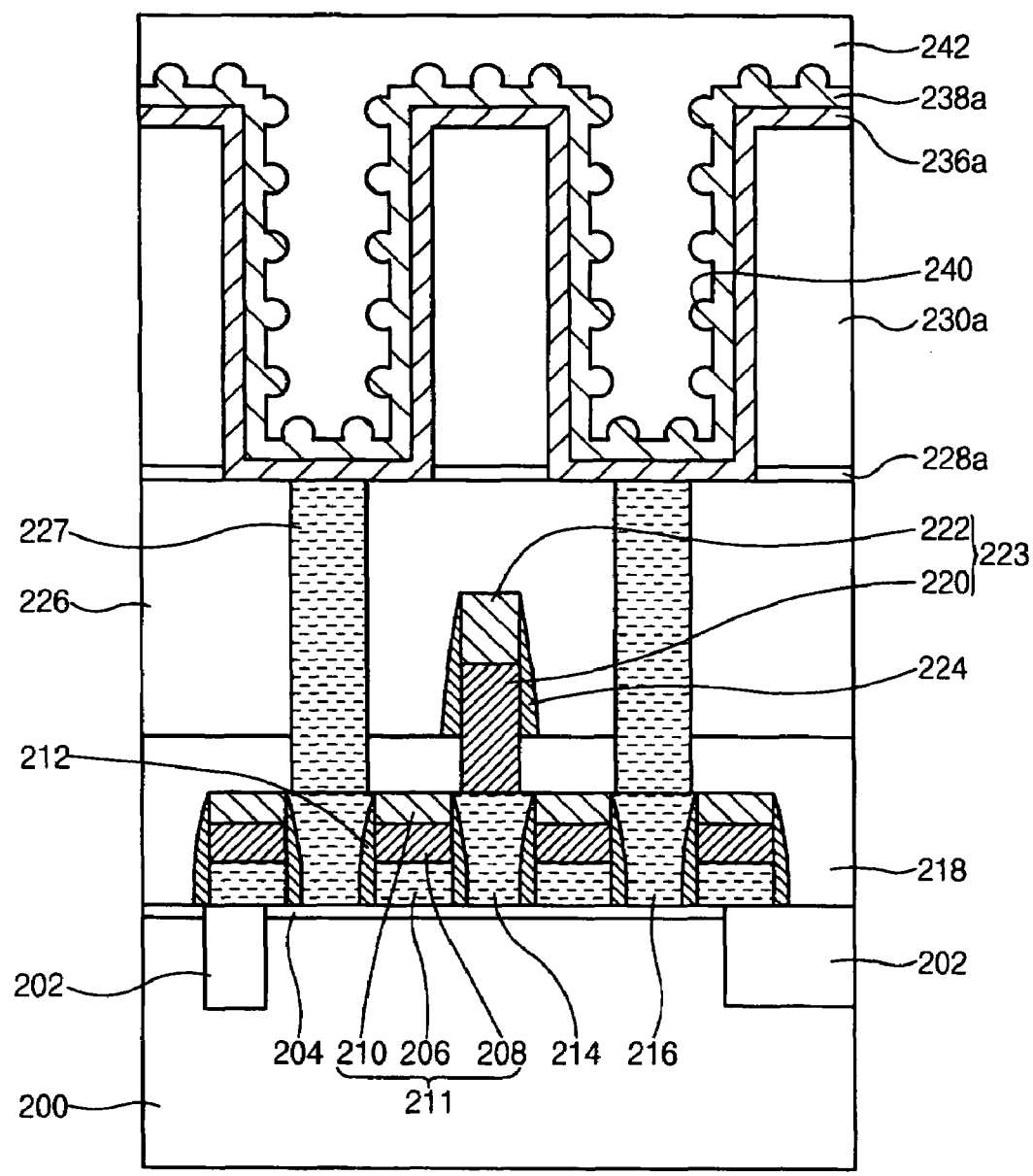

Referring to FIG. 6, a sacrificial insulation layer 242 is formed on the preliminary HSG layer 240 and the crystallized second amorphous silicon layer 238a to fill the fourth openings 234 with the sacrificial insulation layer 242.

Figure 7:
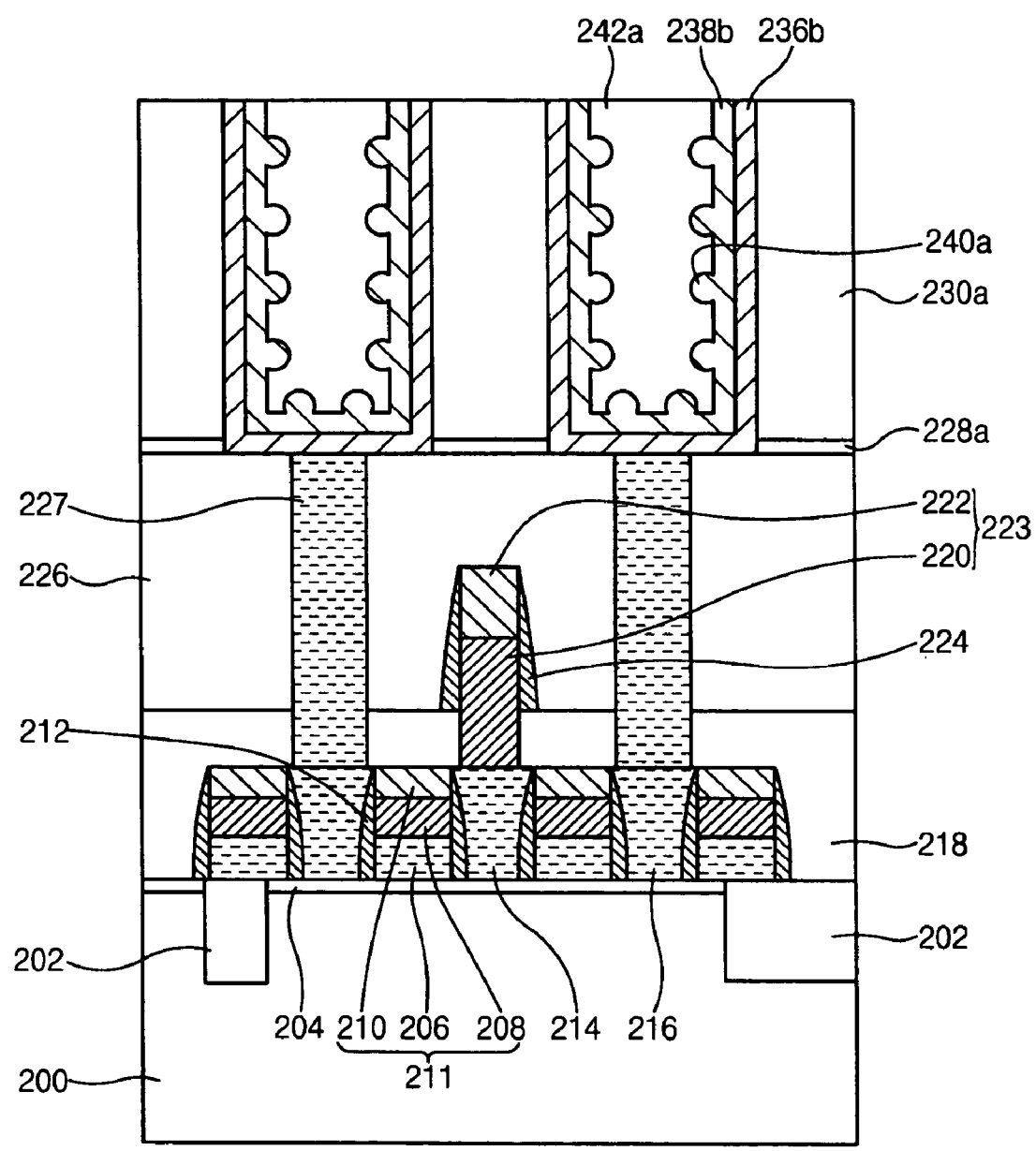

Referring to FIG. 7, the sacrificial insulation layer 242, the preliminary HSG layer 240, the crystallized second amorphous silicon layer 238a and the crystallized first amorphous silicon layer 236a are planarized to expose the third insulation layer 230a to form a sacrificial insulation layer pattern 242a, a HSG layer 240a, a preliminary outer cylinder 236b and a preliminary inner cylinder 238b. The preliminary outer cylinder 236b is formed on inner surfaces of the fourth opening 234. The preliminary inner cylinder 238b is formed on inner surfaces of the preliminary outer cylinder 236b. The HSG layer 240a is formed on inner surfaces of the preliminary inner cylinder 238b.

Figure 8:
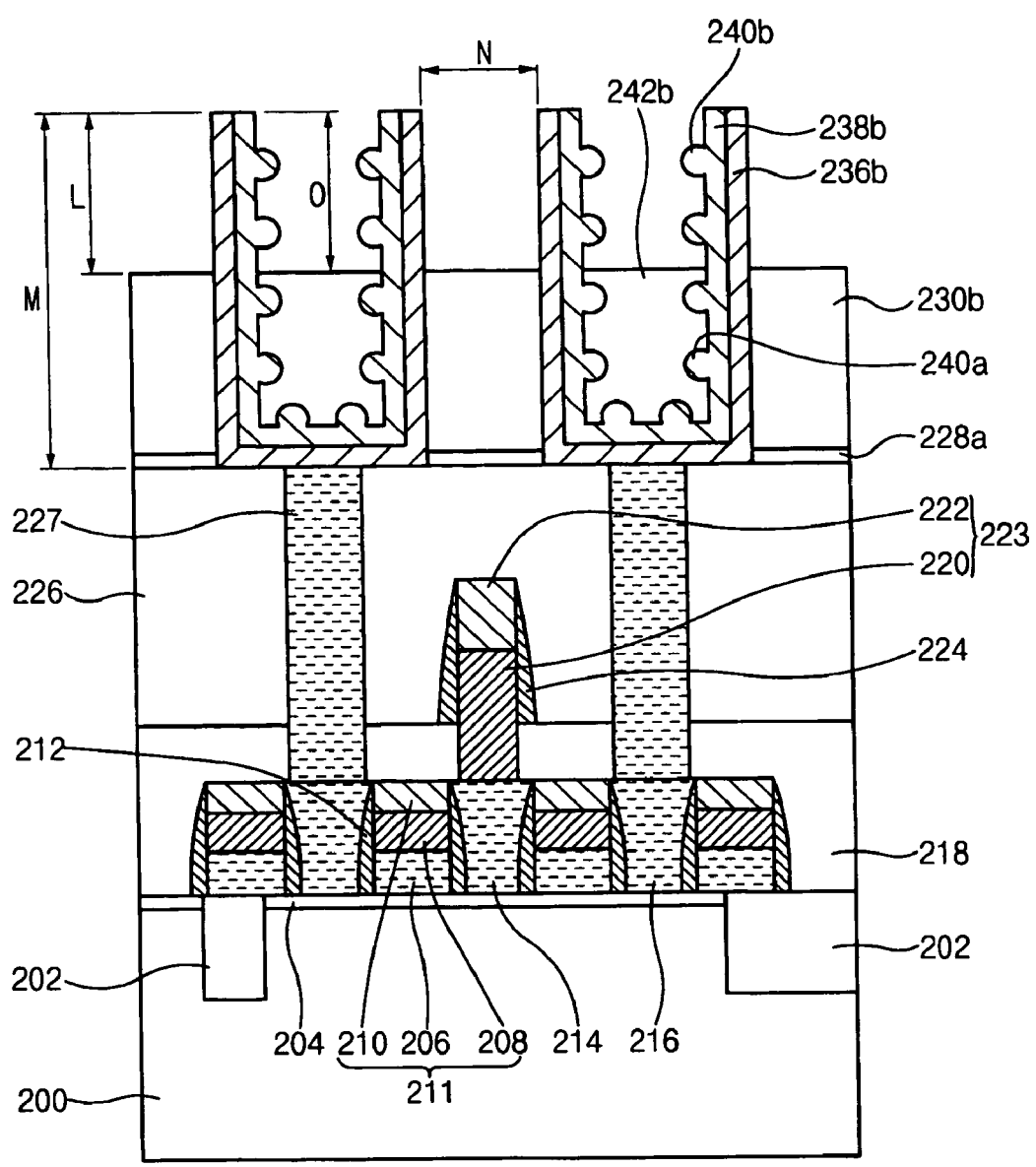

Referring to FIG. 8, the sacrificial insulation layer pattern 242a and the third insulation layer 230a are partially wet-etched using a wet etching solution to expose upper portions of the preliminary outer cylinder 236b, the preliminary inner cylinder 238b and the HSG layer 240b. The wet etching solution may be an aqueous hydrogen fluoride (HF) solution, e.g., LAL.

A height L of the preliminary outer cylinder 236b exposed above the partially-etched third insulation layer 230a may be about 0.3 to about 0.5 times a height M of the preliminary outer cylinder 236b.

An etched thickness of the partially-etched sacrificial insulation layer pattern 242b may vary in accordance with a width N between the storage electrodes, kinds of the wet etching solution, etc. Thus, a height O of the preliminary inner cylinder 238b exposed above the partially-etched third insulation layer 230b may vary.

Figure 9:
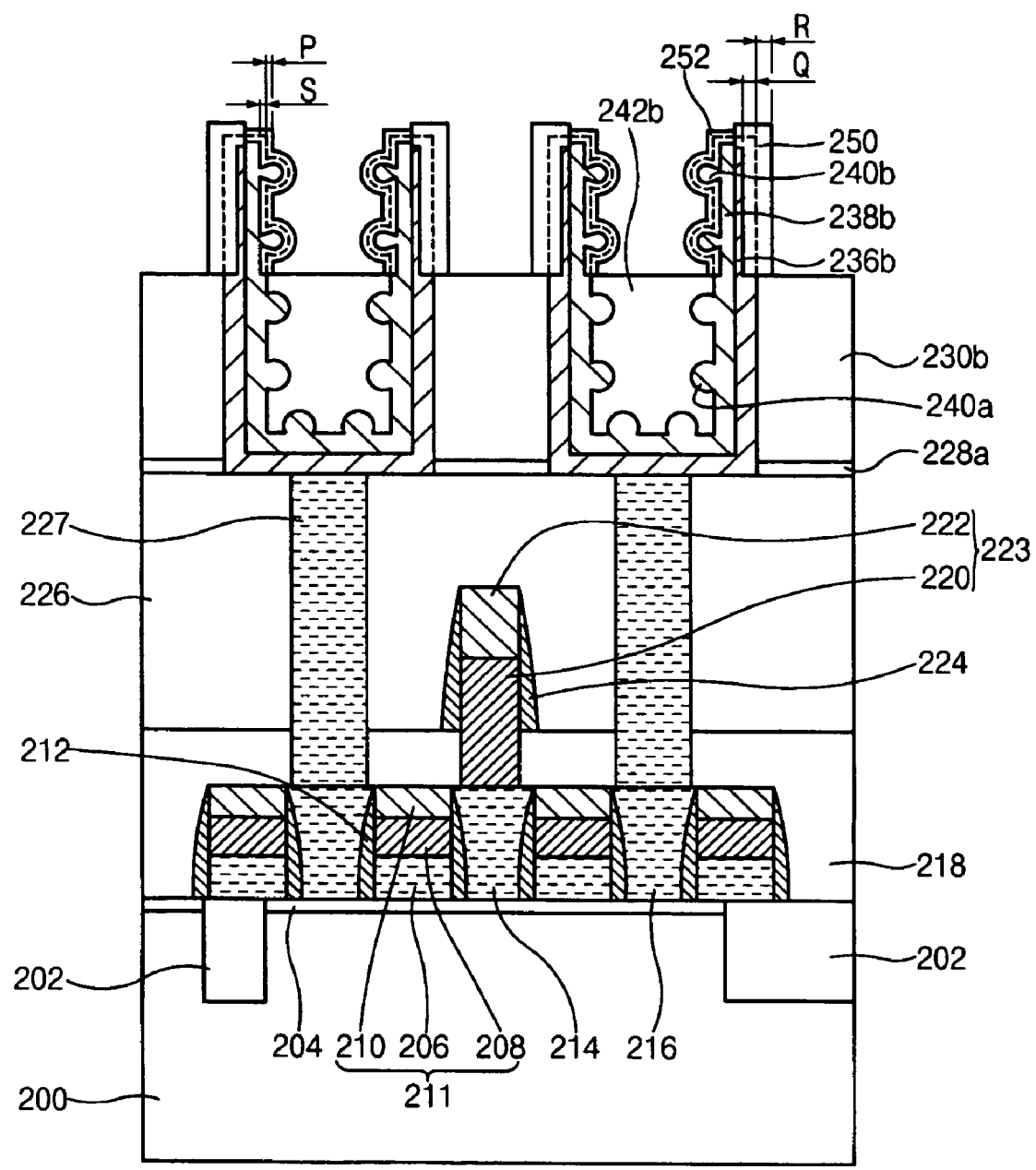

Referring to FIG. 9, the exposed HSG layer 240b, the exposed preliminary outer cylinder 236b and the exposed preliminary inner cylinder 238b are oxidized at a temperature of about 600° C. to about 900° C. to grow an outer oxide layer 250 from the preliminary outer cylinder 236b and an inner oxide layer 252 from the preliminary inner cylinder 238b and the HSG layer 240a. The outer oxide layer 250 has a thickness greater than that of the inner oxide layer 252.

In FIG. 9, dotted lines represent contours of the preliminary outer cylinder 236b, the preliminary inner cylinder 238b and the HSG layer 240b before growing the outer and inner oxide layers 250 and 252. The outer and inner oxide layers 250 and 252 grow in inward and outward directions with respect to the preliminary outer cylinder 236b and the preliminary inner cylinder 238b. Reference characters Q and R represent thicknesses of the outer oxide layer 250 in the inward and outward directions, respectively. Reference characters S and P represent thicknesses of the inner oxide layer 252 in the outward and inward directions, respectively.

Referring to FIG. 10, the outer and inner oxide layers 250 and 252, the partially-etched third insulation layer 230b and the partially-etched sacrificial insulation layer pattern 242b are removed using a wet etching solution to complete the storage electrode 260. The wet etching solution may be an aqueous HF solution, e.g., LAL.

The storage electrode 260 includes a cylinder body 254, a first HSG layer 240b and a second HSG layer 240a. The first and second HSG layers 240b and 240a have different grain sizes. The cylinder body 254 includes an outer cylinder 236c and an inner cylinder 238c. The shape of the storage electrode 260 is previously described in detail with reference to FIG. 1, and additional descriptions of the storage electrode 260 will not be repeated.

A dielectric layer (not shown) is formed on the storage electrode 260. A plate electrode (not shown) is formed on the dielectric layer to complete a capacitor of a semiconductor device including the storage electrode 260, the dielectric layer and the plate electrode.

Second Embodiment

Figure 11:
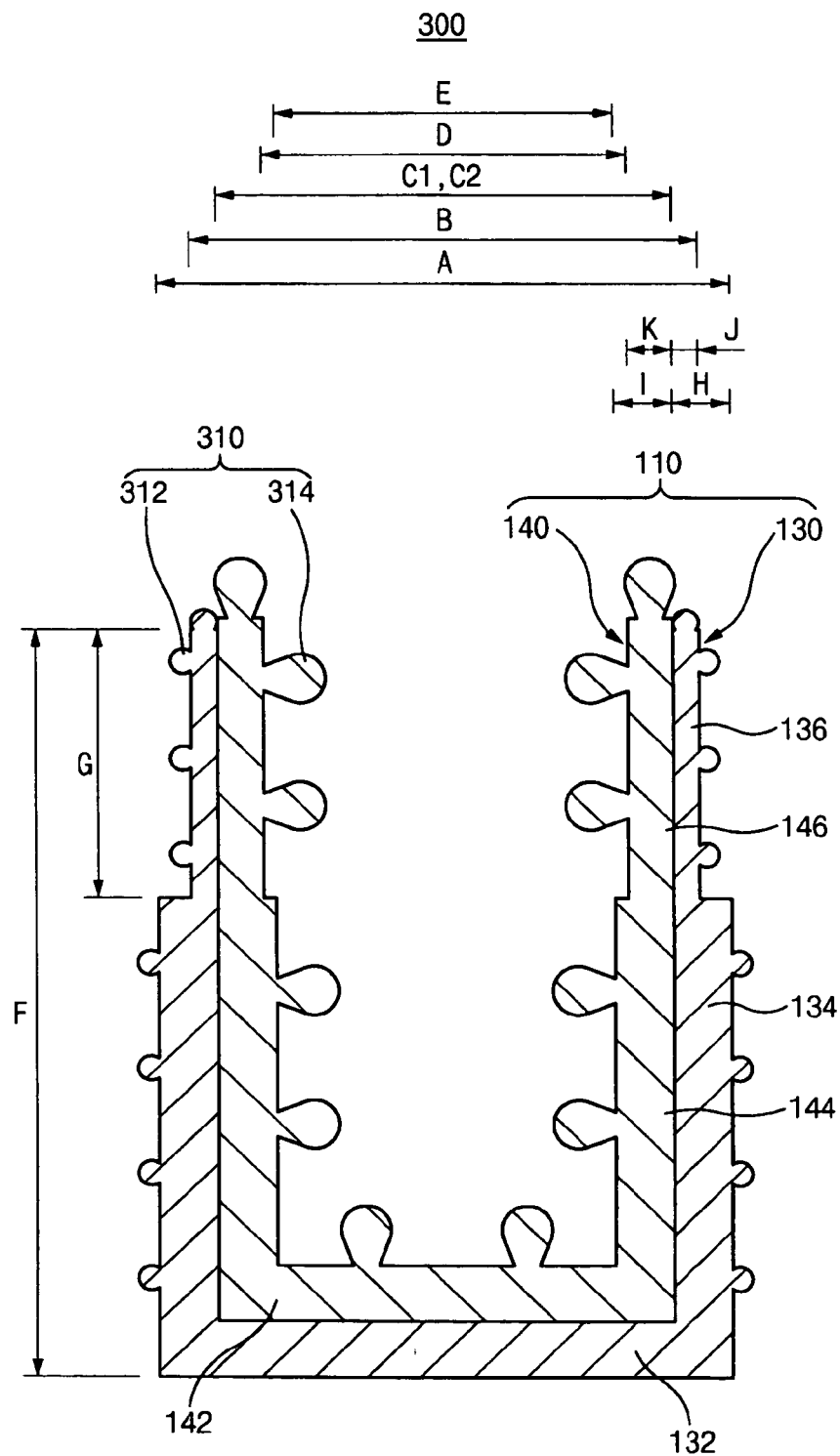
FIG. 11 illustrates a cross-sectional view of a storage electrode of a semiconductor device in accordance with a second embodiment of the present invention.

FIG. 11 illustrates a cross-sectional view of a storage electrode of a semiconductor device in accordance with a second embodiment of the present invention.

A storage electrode of the second embodiment includes elements substantially the same as those of the first embodiment as shown in FIG. 1 except with respect to a HSG layer. As noted above, like reference numerals and characters refer to substantially the same elements and dimensions as in FIG. 1, and detailed descriptions of the common elements and dimensions will not be repeated.

Referring to FIG. 11, a storage electrode 300 in accordance with the second embodiment includes the cylinder body 110 and a HSG layer 310. The cylinder body 110 includes the outer cylinder 130 and the inner cylinder 140 formed on inner surfaces of the outer cylinder 130. The HSG layer 310 is formed on the cylinder body 110.

The outer cylinder 130 may have a cylindrical shape having an open top and the closed bottom surface 132. The outer cylinder 130 may include the first outer cylindrical portion 134 having the first outer diameter A, and the second outer cylindrical portion 136 formed on the first outer cylindrical portion 136, the second outer cylindrical portion 136 having the second outer diameter B, which is less than the first outer diameter A. The first and second outer cylindrical portions 134 and 136 may have substantially equal inner diameters C1.

The inner cylinder 140 may have a cylindrical shape having an open top and the closed bottom surface 142. The inner cylinder 140 may include the first inner cylindrical portion 144 having the first inner diameter D, and the second inner cylindrical portion 146 formed on the first inner cylindrical portion 146, the second inner cylindrical portion 146 having the second inner diameter E, which is greater than the first inner diameter D. The first and second inner cylindrical portions 144 and 146 may have substantially equal outer diameters C2. The outer diameters C2 of the first and second inner cylindrical portions 144 and 146 may be substantially equal to the inner diameters C1 of the first and second outer cylindrical portions 134 and 136.

The HSG layer 310 includes a first HSG layer 312 formed on outer and upper surfaces of the outer cylinder 130, and a second HSG layer 314 formed on inner and upper surfaces of the inner cylinder 140. The first HSG layer 312 has a first grain size, which is less than a second grain size of the second HSG layer 314.

FIGS. 12 through 17 illustrate cross-sectional views of stages in a method of forming the storage electrode in FIG. 11.

Figure 12:
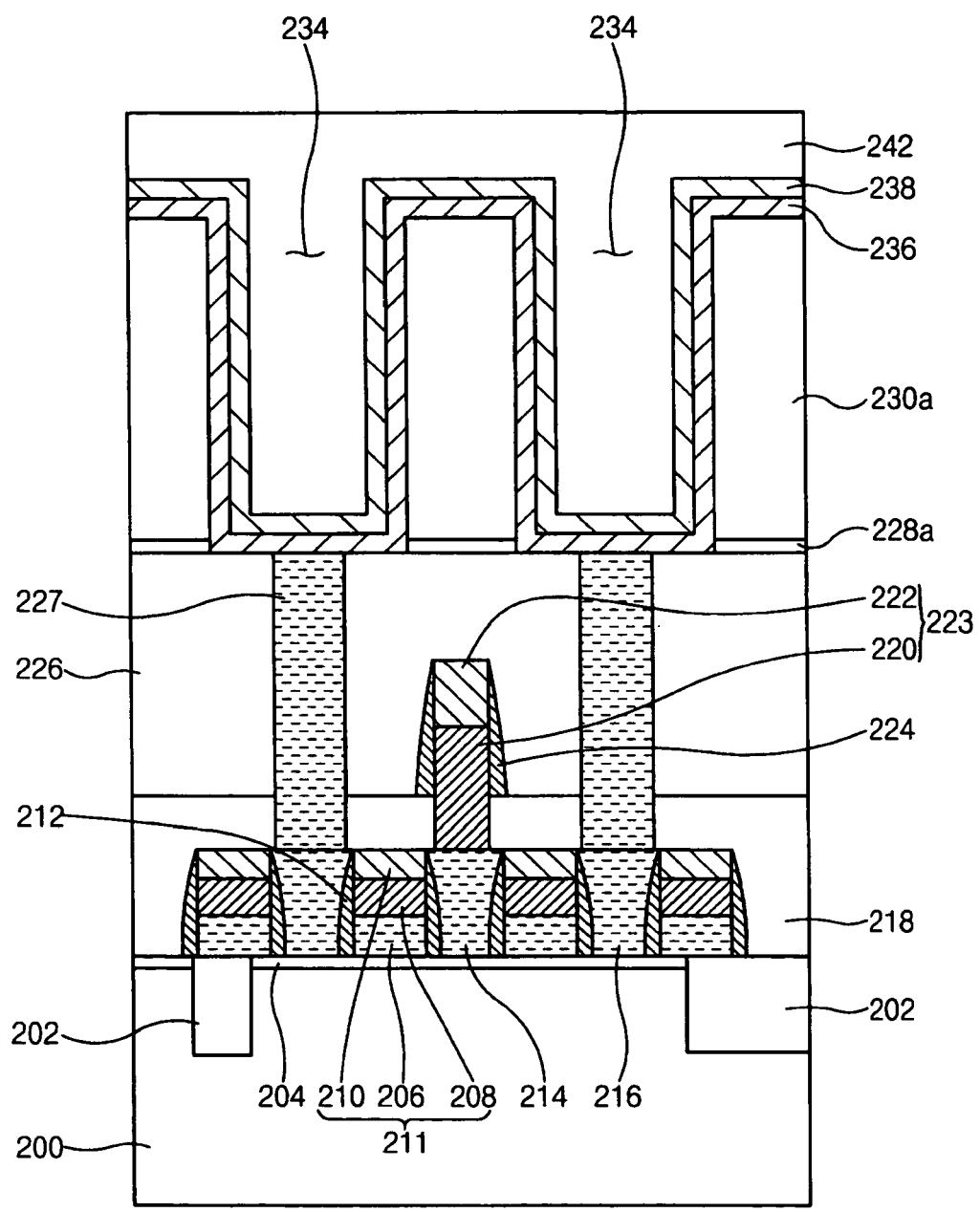
FIGS. 12 through 17 illustrate cross-sectional views of stages in a method of forming the storage electrode shown in FIG. 11.

Referring to FIG. 12, processes for forming the gate electrode structures 211, the bit line structure 223 and the contact plugs 227 are substantially the same as those that are described with reference to FIG. 2. Accordingly, detailed descriptions of the process for forming these common elements will not be repeated.

The etching stop layer (not shown), e.g., a silicon nitride layer, is formed on the second insulation layer 226. A third insulation layer (not shown) used for a mold layer is formed on the etching stop layer. The third insulation layer may have a thickness of about 18,000 Å. A photoresist film (not shown) is formed on the third insulation layer. The photoresist film is exposed and developed to form a photoresist pattern (not shown) for defining a region in which a capacitor is to be formed.

The third insulation layer and the etching stop layer are sequentially etched using the photoresist pattern as an etching mask to form the third insulation layer pattern 230a having the fourth openings 234 and the etching stop layer pattern 228a, thereby exposing the contact plug 227 and the second insulation layer 226 through the fourth openings 234.

The first amorphous silicon layer 236 is formed on the third insulation layer pattern 230a and inner surfaces, i.e., side and bottom surfaces, of the fourth openings 234. The first amorphous silicon layer 236 has the first oxidation rate. Also, the silicon atoms in the first amorphous silicon layer 236 have the first migration speed. The second amorphous silicon layer 238 is formed on the first amorphous silicon layer 236. The second amorphous silicon layer 238 has the second oxidation rate, which is less than the first oxidation rate. Also, the silicon atoms in the second amorphous silicon layer 238 have the second migration speed, which is greater than the first migration speed.

Figure 17:
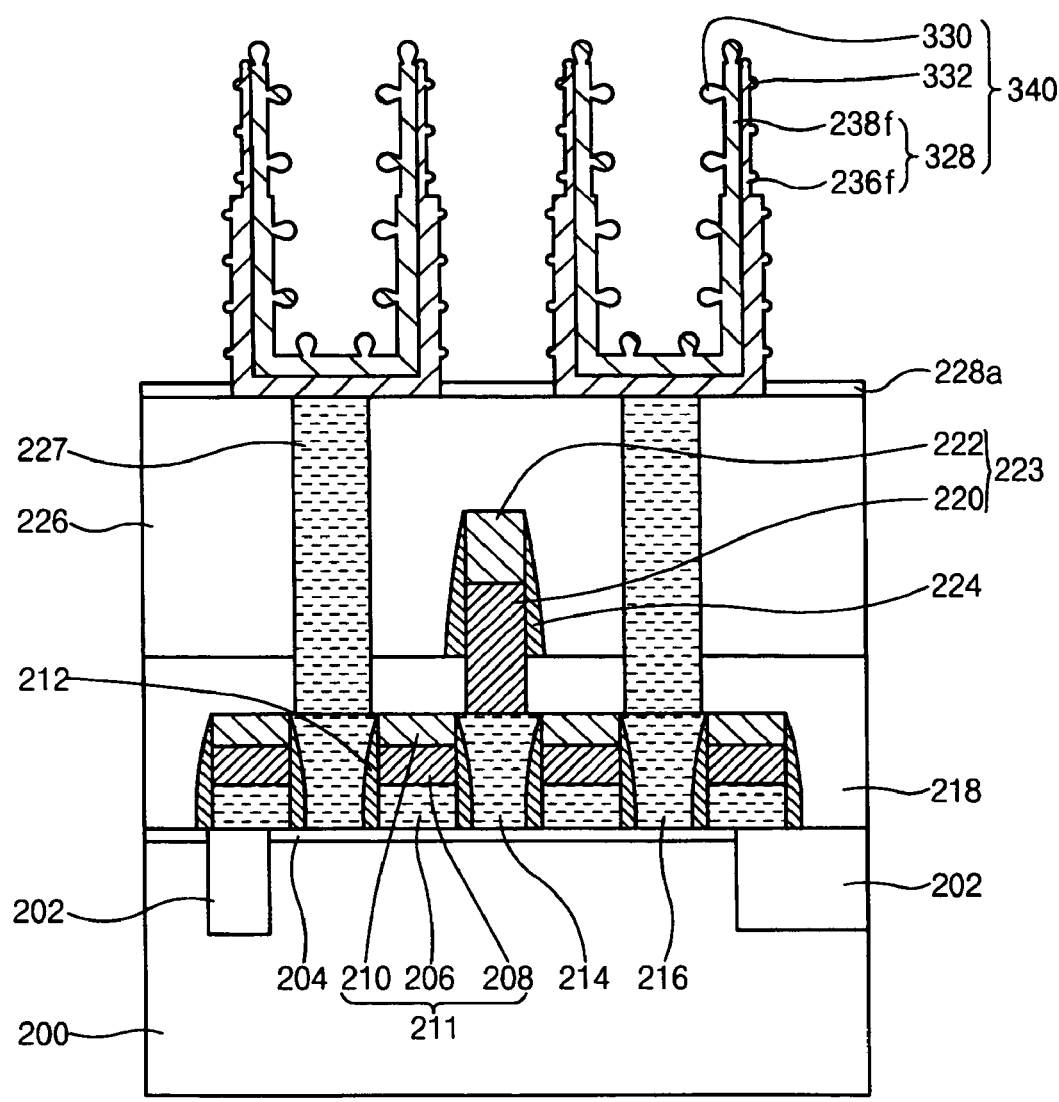

Thus, when the storage electrode, as shown in FIG. 17, is completed by the following processes, the first amorphous silicon layer 236 functions as the outer cylinder of the cylinder body so that an interval between the storage electrodes may be increased. The second amorphous silicon layer 238 functions as the inner cylinder of the cylinder body so that the HSG layer has a wide grain size, thereby increasing a capacitance of a capacitor.

The sacrificial insulation layer 242 is then formed on the second amorphous silicon layer 238 to fill the fourth openings 234 with the sacrificial insulation layer 242.

Figure 13:
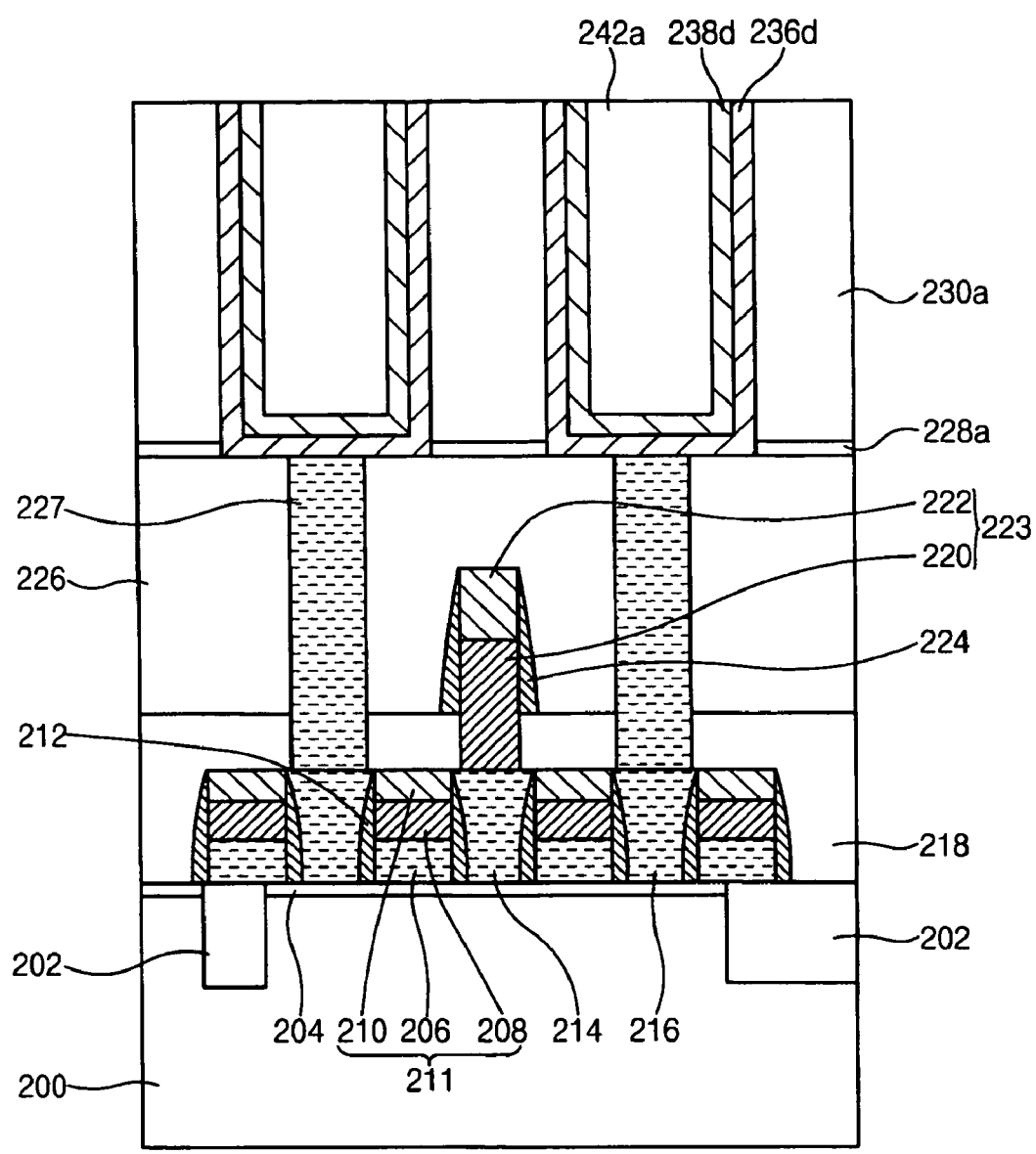

Referring to FIG. 13, the sacrificial insulation layer 242, the second amorphous silicon layer 238 and the first amorphous silicon layer 236 are planarized, e.g., by a CMP process, to expose the third insulation layer 230a to form a sacrificial insulation layer pattern 242a, a preliminary outer cylinder 236d and a preliminary inner cylinder 238d. The preliminary outer cylinder 236d is formed on inner surfaces of the fourth opening 234. The preliminary inner cylinder 238d is formed on inner surfaces of the preliminary outer cylinder 236d.

Figure 14:
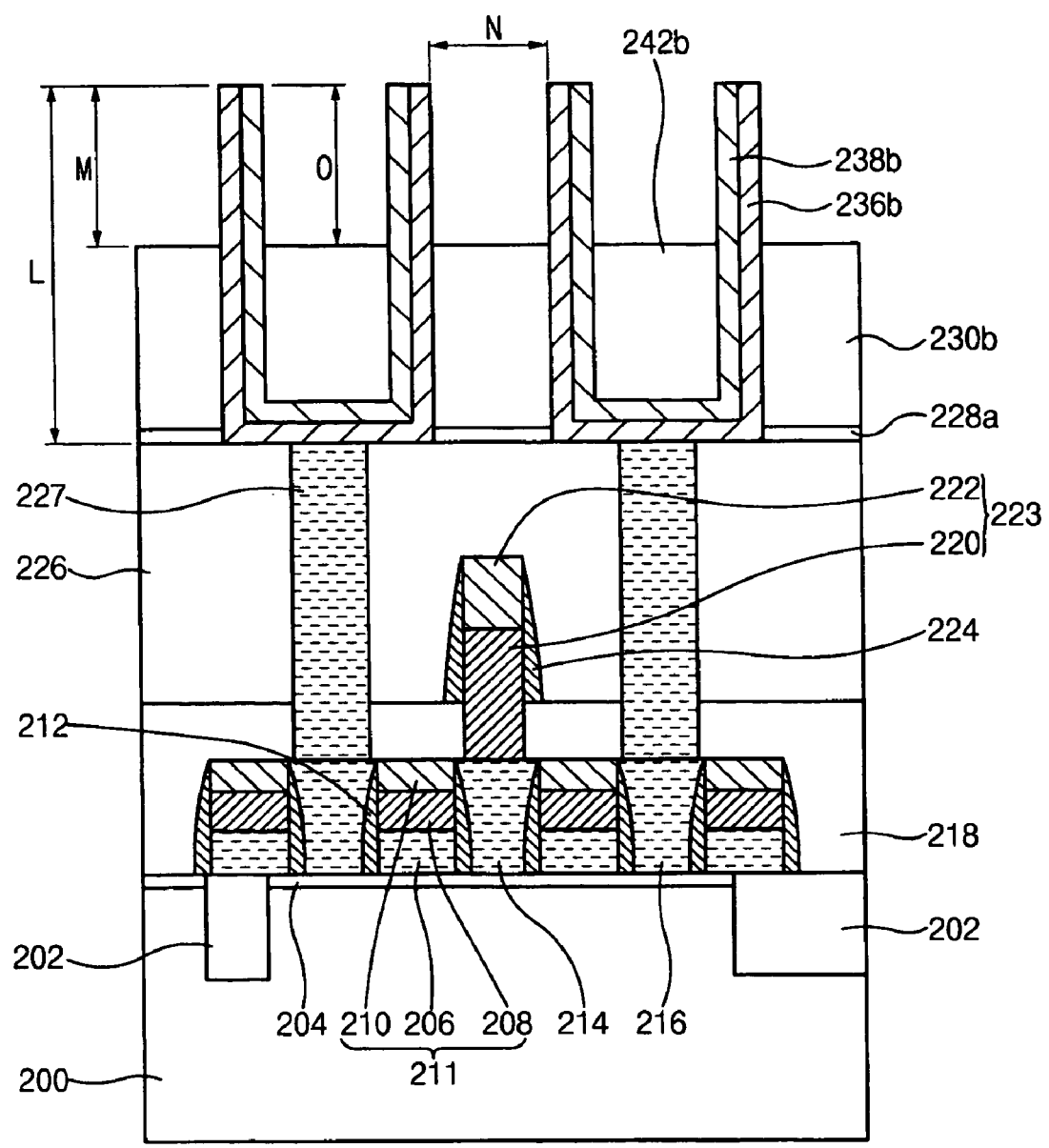

Referring to FIG. 14, the sacrificial insulation layer pattern 242a and the third insulation layer 230a are partially wet-etched using a wet etching solution to expose upper portions of the preliminary outer cylinder 236d and the preliminary inner cylinder 238d. The wet etching solution may be an aqueous HF solution, e.g., LAL.

A height L of the preliminary outer cylinder 236b exposed above the partially-etched third insulation layer 230a may be about 0.3 to about 0.5 times a height M of the preliminary outer cylinder 236d.

An etched thickness of the partially-etched sacrificial insulation layer pattern 242b may vary in accordance with a width N between the storage electrodes, kinds of the wet etching solution, etc. Thus, a height O of the preliminary inner cylinder 238b exposed above the partially-etched third insulation layer 230b may vary.

Figure 15:
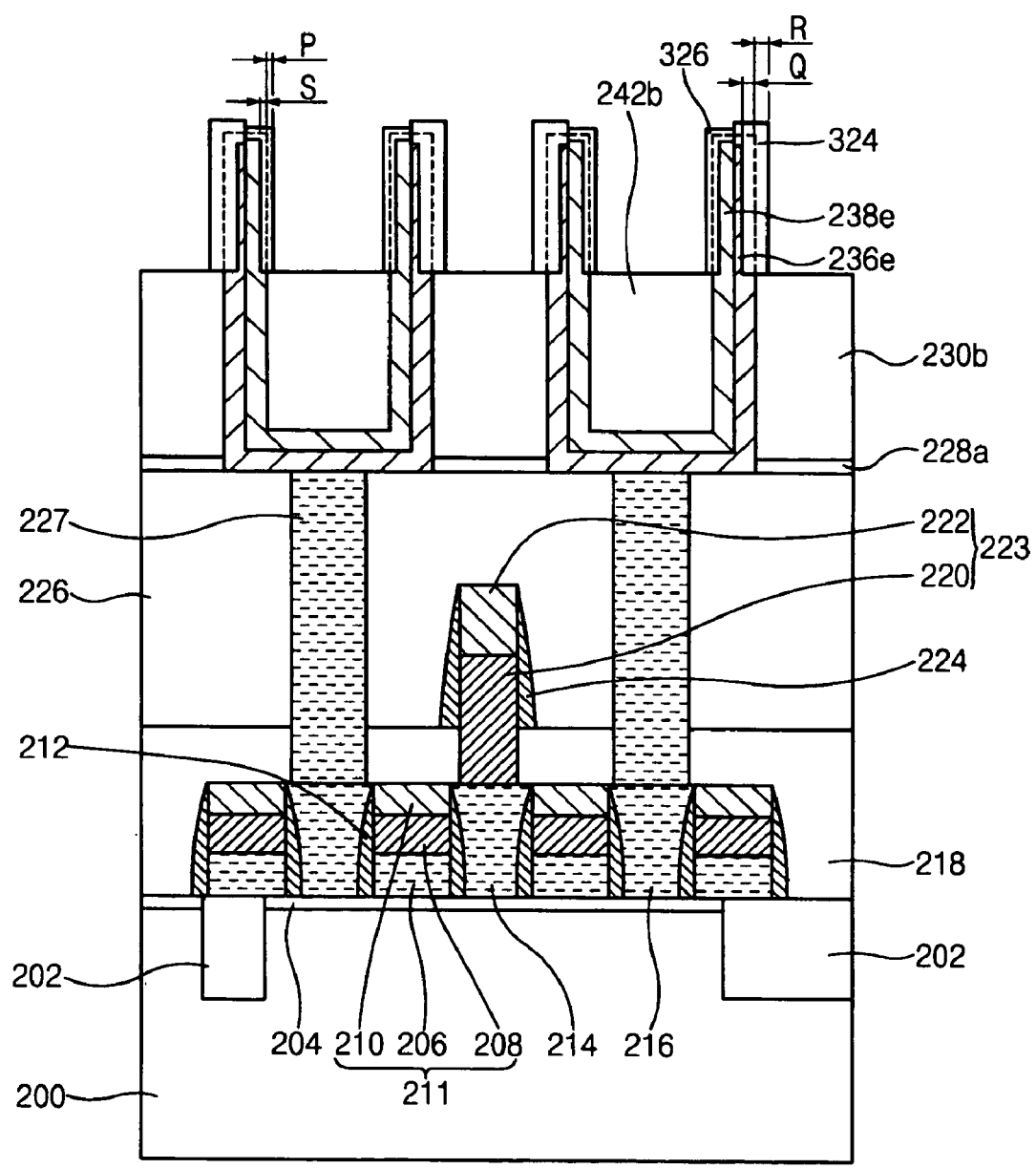

Referring to FIG. 15, the exposed preliminary outer cylinder 236d and the exposed preliminary inner cylinder 238d are oxidized to grow an outer oxide layer 324 from the preliminary outer cylinder 236e and an inner oxide layer 326 from the preliminary inner cylinder 238e. The outer oxide layer 324 has a thickness greater than that of the inner oxide layer 326.

As shown in FIG. 15, dotted lines represent contours of the preliminary outer cylinder 236e and the preliminary inner cylinder 238e before growing the outer and inner oxide layers 324 and 326. The outer and inner oxide layers 324 and 326 grow in inward and outward directions with respect to the preliminary outer cylinder 236e and the preliminary inner cylinder 238e. Reference characters Q and R represent thicknesses of the outer oxide layer 324 in the inward and outward directions, respectively. Reference characters S and P represent thicknesses of the inner oxide layer 326 in the outward and inward directions, respectively.

Figure 16:
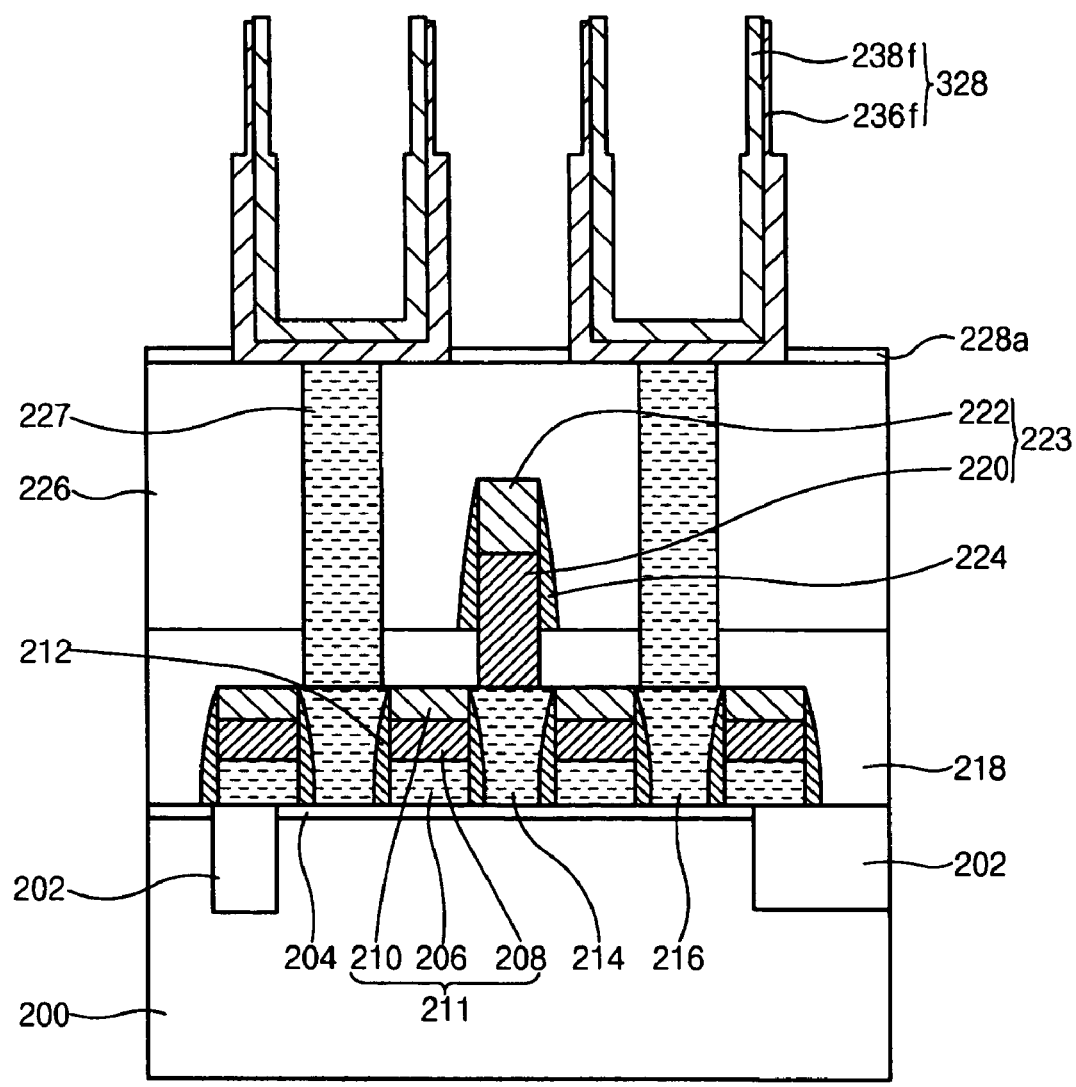

Referring to FIG. 16, the outer and inner oxide layers 324 and 326, the partially-etched third insulation layer 230b and the partially-etched sacrificial insulation layer pattern 242b are removed using a wet etching solution to complete a cylinder body 328 including an outer cylinder 236f and an inner cylinder 238f. The wet etching solution may be an aqueous HF solution, e.g., LAL.

Referring to FIG. 17, a silane based gas is applied to the outer cylinder 236f and the inner cylinder 238f. The silicon atoms are reacted with the silane atoms to grow a first HSG layer 332 from the outer cylinder 236f and a second HSG layer 330 from the inner cylinder 238f. The first HSG layer 332 has a grain size smaller than that of the second HSG layer 330.

As a result, a storage electrode 340 including the cylinder body 328, the first HSG layer 332 and the second HSG layer 330 is completed. The shape of the storage electrode 340 is previously described in detail with reference to FIG. 11, and additional descriptions of the storage electrode 340 will not be repeated.

A dielectric layer (not shown) is formed on the storage electrode 340. A plate electrode (not shown) is formed on the dielectric layer to complete a capacitor of a semiconductor device including the storage electrode 340, the dielectric layer and the plate electrode.

According to the present invention, adjacent storage electrodes are spaced sufficiently far apart from each other so that a 2-bit error generated between leaning storage electrodes may be prevented and formation of a bridge between the leaning storage electrodes may be avoided.

Also, the HSG layer may not exist on outer surfaces of the storage electrode or the HSG layer on outer surfaces of the storage electrode may have a relatively smaller size as compared to that of the HSG layer on inner surfaces of the storage electrode, so that formation of a bridge between adjacent storage electrodes may be avoided.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A storage electrode of a semiconductor device, comprising:
   an outer cylinder including a first outer cylindrical portion having a first outer diameter, and a second outer cylindrical portion that is formed on the first outer cylindrical portion and having a second outer diameter, which is less than the first outer diameter, the first and second outer cylindrical portions having substantially equal inner diameters; and
   an inner cylinder formed on inner surfaces of the outer cylinder.

2. The storage electrode as claimed in claim 1, wherein the outer cylinder further comprises a closed outer bottom surface, and the inner cylinder further comprises a closed inner bottom surface formed on the closed outer bottom surface.

3. The storage electrode as claimed in claim 1, wherein the inner cylinder comprises:
   a first inner cylindrical portion having a first inner diameter; and
   a second inner cylindrical portion formed on the first inner cylindrical portion and having a second inner diameter, which is greater than the first inner diameter, the first and second inner cylindrical portions having substantially equal outer diameters.

4. The storage electrode as claimed in claim 3, wherein a thickness of the first inner cylindrical portion is about 200 Å to about 600 Å.

5. The storage electrode as claimed in claim 3, wherein a thickness of the second inner cylindrical portion is about 20 Å to about 100 Å less than a thickness of the first inner cylindrical portion.

6. The storage electrode as claimed in claim 3, wherein the inner cylinder further comprises a hemispherical silicon grain (HSG) layer.

7. The storage electrode as claimed in claim 6, wherein the HSG layer is formed on inner surfaces of the inner cylinder.

8. The storage electrode as claimed in claim 7, wherein the HSG layer comprises:
   a first HSG layer formed on inner surfaces of the second inner cylindrical portion and having a first grain size; and
   a second HSG layer formed on inner surfaces of the first inner cylindrical portion and having a second grain size, which is greater than the first grain size.

9. The storage electrode as claimed in claim 6, wherein the HSG layer is formed on inner surfaces of the inner cylinder and outer surfaces of the outer cylinder.

10. The storage electrode as claimed in claim 9, wherein the HSG layer comprises:
    a first HSG layer formed on outer and upper surfaces of the outer cylinder and having a first grain size; and
    a second HSG layer formed on inner and upper surfaces of the inner cylinder and having a second grain size, which is greater than the first grain size.

11. The storage electrode as claimed in claim 1, wherein a height of the second outer cylindrical portion is about 0.3 to about 0.5 times a height of the outer cylinder.

12. The storage electrode as claimed in claim 1, wherein a thickness of the first outer cylindrical portion is about 200 Å to about 600 Å.

13. The storage electrode as claimed in claim 1, wherein a thickness of the second outer cylindrical portion is about 20 Å to about 100 Å less than a thickness of the first outer cylindrical portion.

14. The storage electrode as claimed in claim 1, wherein an oxidation rate of the outer cylinder is greater than an oxidation rate of the inner cylinder.

15. The storage electrode as claimed in claim 14, wherein a migration speed of atoms in the outer cylinder is less than a migration speed of atoms in the inner cylinder.

16. The storage electrode as claimed in claim 1, wherein the outer cylinder comprises a heavily doped amorphous silicon layer.

17. The storage electrode as claimed in claim 16, wherein the outer cylinder is doped with phosphorous having a concentration of about $10 \times 10^{10}$ to about $5 \times 10^{21}$ atoms/cm$^3$.

18. The storage electrode as claimed in claim 1, wherein the inner cylinder comprises a lightly doped amorphous silicon layer.

19. The storage electrode as claimed in claim 18, wherein the inner cylinder is doped with phosphorous having a concentration of about $10 \times 10^{19}$ to about $5 \times 10^{21}$ atoms/cm$^3$.

20. A storage electrode of a semiconductor device, comprising:
    a cylinder body including an outer cylinder, and an inner cylinder formed on inner surfaces of the outer cylinder; and
    a hemispherical silicon grain (HSG) layer including a first HSG layer formed on upper inner side surfaces of the inner cylinder and having a first grain size, and a second HSG layer formed on lower inner side surfaces of the inner cylinder and having a second grain size, which is greater than the first grain size.

21. The storage electrode as claimed in claim 20, wherein the outer cylinder comprises a closed outer bottom surface, the inner cylinder comprises a closed inner bottom surface formed on the closed outer bottom surface, and the second HSG layer is formed on the closed inner bottom surface.

* * * * *